(12) United States Patent
Muthinti et al.

(10) Patent No.: US 10,741,609 B2
(45) Date of Patent: Aug. 11, 2020

(54) PRE-PATTERNED ETCH STOP FOR INTERCONNECT TRENCH FORMATION OVERLYING EMBEDDED MRAM STRUCTURES

(71) Applicant: INTERNATIONAL BUSINESS MACHINES CORPORATION, Armonk, NY (US)

(72) Inventors: Gangadhara Raja Muthinti, Albany, NY (US); Michael Rizzolo, Delmar, NY (US); Oscar Van Der Straten, Guilderland Center, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/242,583

(22) Filed: Jan. 8, 2019

(65) Prior Publication Data

US 2020/0219932 A1 Jul. 9, 2020

(51) Int. Cl.
| | |
|---|---|
| *H01L 43/12* | (2006.01) |
| *H01L 27/22* | (2006.01) |
| *H01L 43/14* | (2006.01) |
| *H01L 23/528* | (2006.01) |
| *H01L 23/522* | (2006.01) |
| *H01L 43/02* | (2006.01) |
| *H01L 43/08* | (2006.01) |
| *H01L 43/10* | (2006.01) |

(52) U.S. Cl.
CPC ............ *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC ................................ H01L 27/12; H01L 27/14
See application file for complete search history.

(56) References Cited

U.S. PATENT DOCUMENTS

| | | | |
|---|---|---|---|
| 6,783,999 B1 | 8/2004 | Lee | |
| 7,227,244 B2 | 6/2007 | Bjorkman et al. | |
| 8,617,982 B2 | 12/2013 | Danek et al. | |
| 8,883,520 B2 | 11/2014 | Satoh et al. | |
| 9,318,696 B2 | 4/2016 | Lu et al. | |
| 9,349,939 B2 | 5/2016 | Lu et al. | |
| 9,379,010 B2 | 6/2016 | Jezewski et al. | |
| 9,911,623 B2 | 3/2018 | Chang et al. | |
| 2013/0260553 A1 | 10/2013 | Yoo et al. | |
| 2017/0092693 A1* | 3/2017 | Tan | H01L 27/228 |
| 2019/0165258 A1* | 5/2019 | Peng | H01L 43/12 |

(Continued)

OTHER PUBLICATIONS

Gaidis, M.C., et al., "Two-level BEOL processing for rapid iteration in MRAM development", IBM Journal of Research and Development, Jan. 2006, vol. 50, No. 1, pp. 41-54.

(Continued)

*Primary Examiner* — Moazzam Hossain
(74) *Attorney, Agent, or Firm* — Cantor Colburn LLP; Vazken Alexanian

(57) ABSTRACT

Integration of structures including an embedded magnetoresistive random access memory (MRAM) device such as a magnetic tunneling junction device includes pre-patterned etch stop layers to prevent excessive etching of the interlayer dielectric during a via open step.

7 Claims, 6 Drawing Sheets

(56) References Cited

U.S. PATENT DOCUMENTS

2019/0273117 A1* 9/2019 Hung ................ H01F 41/34
2020/0006634 A1* 1/2020 Brockman ........... H01L 43/08
2020/0098982 A1* 3/2020 Chuang ........... H01L 21/76802

OTHER PUBLICATIONS

King, S.W., "Dielectric barrier, etch stop, and metal capping materials for state of the art and beyond metal interconnects", ECS Journal of Solid State Science and Technology, 2015, vol. 4, No. 1, pp. N3029-N3047.

* cited by examiner

PRE-PATTERNED ETCH STOP FOR INTERCONNECT TRENCH FORMATION OVERLYING EMBEDDED MRAM STRUCTURES

BACKGROUND

The present invention generally relates to semiconductor integrated circuits, and more particularly, to the structure and formation of an interconnect level overlying embedded magnetoresistive random access memory (MRAM) devices. The structure and formation of the interconnect level includes providing pre-patterned etch stops for trenches so as to control trench depth, which can be done in both non-MRAM and embedded MRAM areas.

Embedded magnetic random access memory (MRAM) can be used to replace embedded flash memory or embedded dynamic random access memory (DRAM) for its unique features of writing/reading speed, writing endurance, and low power consumption. In order to make embedded MRAM production-worthy, one must not only overcome the technical challenges of making the magnetic junction array to meet the embedded memory product design requirements including read/write speed, read/write current limits, reading margin, long-term thermal stability, etc., but also integrate the memory array seamlessly with the peripheral logic circuit which normally occupies the majority of the space.

SUMMARY

Embodiments of the present invention are generally directed to a method for forming interconnect level overlying embedded magnetoresistive random access memory (MRAM) devices. A non-limiting example of the method includes providing a wafer having an embedded MRAM interconnect level having metal interconnects formed within a first interlayer dielectric. At least one of the metal interconnects functions as a bottom electrode for the embedded MRAM device formed thereon to define a MRAM area. The MRAM device structurally forms a pillar having a height greater than a height of the metal interconnects provided in a non-MRAM area. The method further includes depositing an insulating layer onto the wafer and depositing a portion of a second interlayer dielectric onto the insulating layer to a thickness equal to a combined height provided by the insulating layer and the MRAM device. The method further includes depositing an etch stop layer onto the portion of the second interlayer dielectric at the combined height and patterning the etch stop layer to form a patterned etch stop overlying lines in the non-MRAM area. The method further includes depositing a remaining portion of the second interlayer dielectric and depositing a multilayer lithographic structure onto the second interlayer dielectric. The multilayer lithographic structure includes a sacrificial nitride layer and a hardmask layer thereon. The method further includes patterning the sacrificial nitride layer and the hardmask layer to provide trench and via openings and etching the via opening to the insulating layer. The via opening is self-aligned to an one of the metal interconnects in the non-MRAM area. The method further includes etching the trench opening in the non-MRAM area to the etch stop layer and to the insulating layer overlying the MRAM device in the MRAM area and removing the insulating layer at the bottom of the via opening and on the MRAM device to expose the underlying metal interconnect in the non-MRAM area and a top electrode of the MRAM device.

A non-limiting example of the semiconductor structure includes an embedded magnetoresistive random access memory (MRAM) device having a first metal interconnect level includes a plurality of first metal conductors provided in a first interlayer dielectric and an insulating layer on the first interconnect level. At least one of the metal conductors is configured as a bottom electrode for an embedded MRAM structure thereon. The embedded MRAM structure forms a pillar relative to the metal conductors and defines a MRAM area and the metal conductors not configured as the bottom electrode define a non-MRAM area. The structure further includes a second metal interconnect overlying the first metal interconnect level including the embedded MRAM device. The second interconnect level includes a plurality of second metal conductors having line and/or via features provided in a second interlayer dielectric. The second metal interconnect includes an etch stop under the line features in the non-MRAM area.

A non-limiting example of the semiconductor structure includes an embedded magnetic tunneling junction (MTJ) device having a first metal interconnect level having a plurality of first metal conductors provided in a first interlayer dielectric and an insulating layer on the first interconnect level. At least one of the metal conductors is configured as a bottom electrode for an embedded MTJ structure thereon. The embedded MTJ structure forms a pillar relative to the first metal conductors. The device further includes a second metal interconnect level overlying the first metal interconnect level including the embedded MTJ device. The second interconnect level includes a plurality of second metal conductors having line and/or via features provided in a second interlayer dielectric. The second metal interconnect includes an etch stop under the line features. The etch stop is at a height greater than a height of the embedded MTJ structure.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Prior Art

Prior Art

Prior Art

Prior Art

Prior Art

Prior Art

DETAILED DESCRIPTION

Current magnetoresistive random access memory (MRAM) integration schemes, wherein an interconnect level overlies an embedded MRAM device, include simultaneous etch of a cap layer and an interlayer dielectric to form the interconnect level overlying the embedded MRAM device. However, the etch process, which is a directional etch process such as reactive ion etch, results in a three to four times faster etch rate for the interlayer dielectric relative to the cap layer. As a result, the non-MRAM trenches (lines) are much deeper than desired, which can lead to shorts with other metal interconnects within the non-MRAM areas. Moreover, the formation of fangs can result in the MRAM area given the loss of dielectric therein that overlies the MRAM device.

Figure 1:
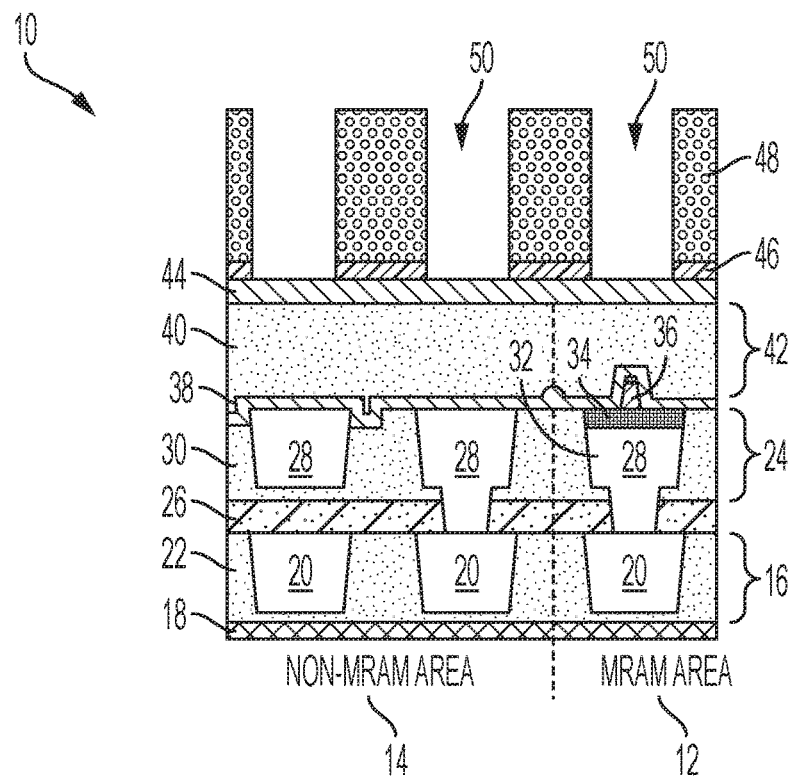
FIG. 1 depicts a cross section of an intermediate structure including a non-magnetoresistive random access memory area (non-MRAM area) including various interconnect levels and a MRAM area including an embedded MRAM device through trench hardmask open.

Prior Art FIGS. 1-6 illustrates a cross sectional view of a typical MRAM integration scheme that includes the formation of an interconnect level overlying an embedded MRAM device. Referring now to FIG. 1, a structure 10 is depicted that generally includes an MRAM area 12 and a non-MRAM area 14. The structure 10 includes a first interconnect level 16 formed on a planar cap layer 18 including one or more metal lines 20 embedded within an interlayer dielectric 22; a second interconnect level 24 formed on cap layer 26 including metal interconnects 28 embedded within a interlayer dielectric 30. The metal interconnects can include trench and via features to provide conductive pathways to one or more of the underlying metal lines 20. Additionally, in the MRAM area 12, the metal interconnects 28 includes a bottom electrode, which includes a bulk conductor 32 such as copper or the like and a conductive metal cap 34 such as tantalum to provide a planar surface for forming a desired MRAM device thereon such as the illustrated magnetic tunneling junction (MTJ) device 36. A cap layer 38 is provided on the MTJ 36 in the MRAM area 12, on the interlayer dielectric 30, and on top surfaces of the metal interconnects 28 in the non-MRAM area 14.

Fabrication of a third interconnect level 42 is formed over the embedded MRAM and includes an interlayer dielectric 40 deposited onto the cap layer 38. It should be noted that reference to the first, second or third interconnect level refers to the location of the interconnect level to one another. It is not intended to refer to the location within the overall structure or the amount or interconnect levels within the structure. The interlayer dielectric is patterned by depositing a multilayered lithographic structure. For example, the multilayered lithographic structure, which is not intended to be limited can include, for example, a sacrificial nitride layer 44, a hardmask layer 46 formed of titanium nitride, and an organic planarizing layer 48. The organic planarizing layer 48 can be lithographically patterned to form openings 50 therein and corresponding openings in the hardmask layer 46. The openings 50 are generally aligned with the underlying metal interconnects 28 and the MTJ 36 embedded within the dielectric 40

Figure 2:
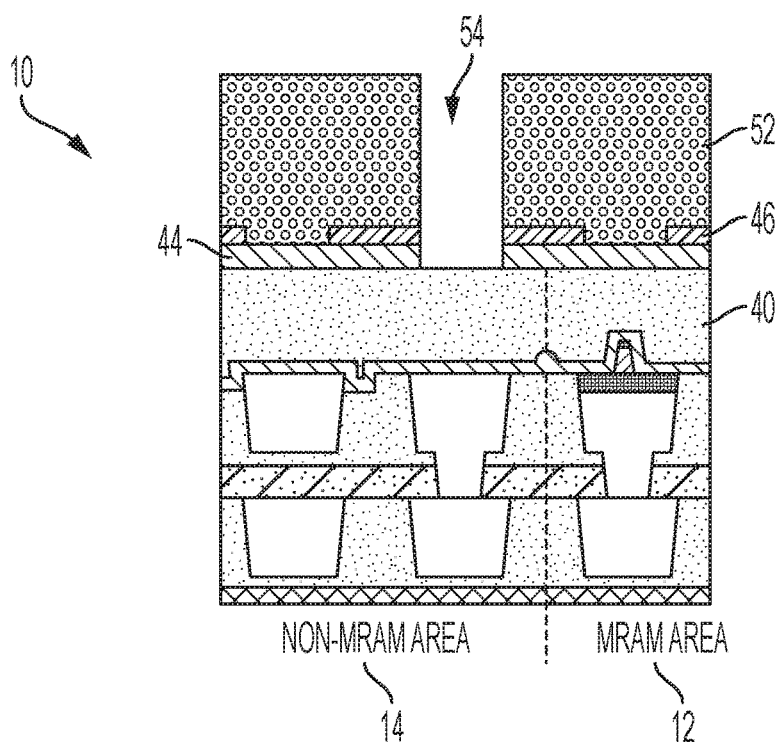
FIG. 2 depicts a cross section of the structure of Prior Art FIG. 1 subsequent to self-aligned via hardmask opening.

In Prior Art FIG. 2, the organic planarizing layer 48 is removed and a second organic planarizing layer 52 is deposited (i.e., a second block mask) and lithographically patterned to form openings 54 therein and open hardmask sacrificial nitride layer 44.

Figure 3:
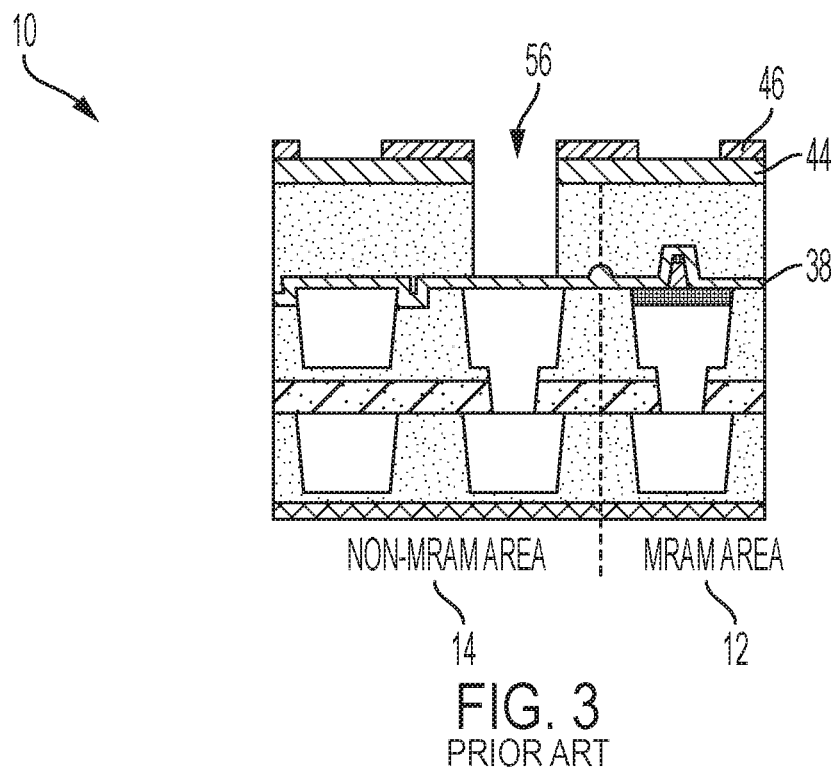
FIG. 3 depicts a cross section of the structure of Prior Art FIG. 2 subsequent to self-aligned via dielectric etch.

In Prior Art FIG. 3, the organic planarizing layer 52 is removed and the substrate 10 is subjected to a self-aligned via dielectric etch of interlayer dielectric 40 through the openings in the hardmask 46 and sacrificial nitride layer 44 to form a via opening 56 stopping at cap layer 38.

Figure 4:
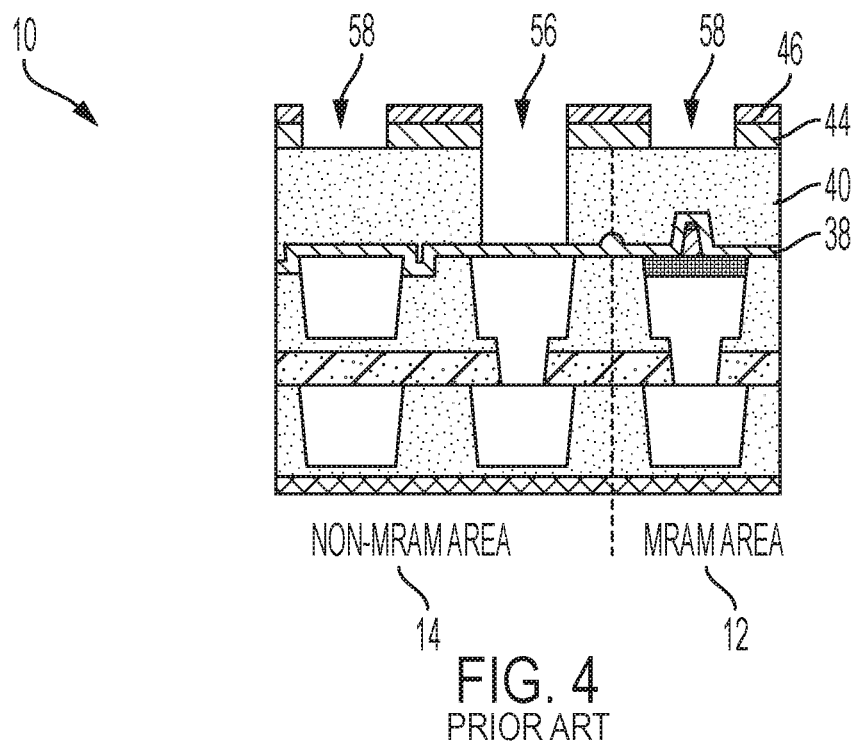
FIG. 4 depicts a cross section of the structure of Prior Art FIG. 3 subsequent to trench etch sacrificial nitride etch opening.

In Prior Art FIG. 4, the sacrificial nitride layer 44 is etched to interlayer dielectric 40 to provide openings 58. The cap layer 38 remains intact.

Figure 5:
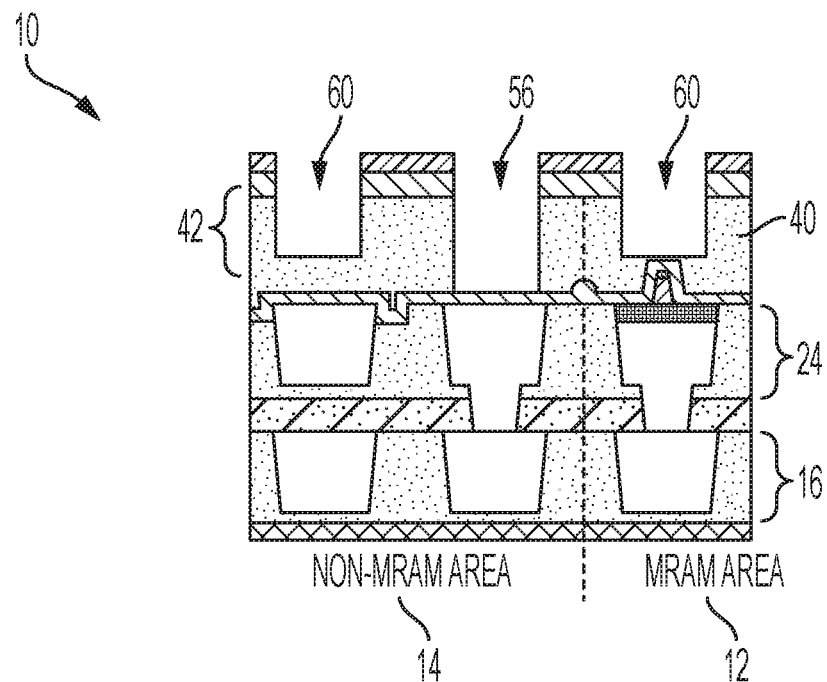
FIG. 5 depicts a cross section of the structure of Prior Art FIG. 4 subsequent to trench dielectric etch.

In Prior Art FIG. 5, trench dielectric etch is performed using a directional etch process such as reactive ion etch, wherein trenches 60 are etched in the interlayer dielectric 40 stopping on the capping layer 38 at a depth corresponding to height of the capping layer overlying the embedded MTJ 36 such that a fractional thickness of the interlayer dielectric layer 40 remains under each of the trench features 60.

Figure 6:
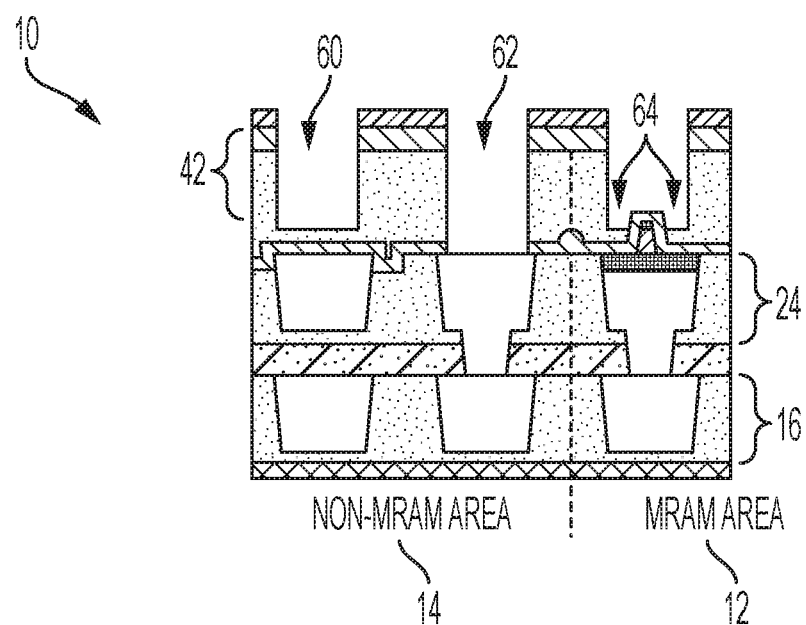
FIG. 6 depicts a cross section of the structure of Prior Art FIG. 5 subsequent to cap etch.

In Prior Art FIG. 6, the via cap layer 38 is opened in the non-MRAM area 14 to expose underlying conductor 28 by a directional etch process. Additionally, the cap layer 38 is removed from the MRAM area 12 to expose the top electrode of the MTJ device. The problem with the prior art process as described above and the resulting structure is that the directional cap etch removes all or a portion of the fractional thickness in the trench openings 60 since the dielectric etches at a rate much faster than the etch rate of the cap layer 38, e.g., typically about four times the etch rate or greater given the differences in the materials. Consequently, the lines in the non-MRAM area 14 are relatively deep, which can result in shorting between metal interconnect lines. Moreover, the dielectric 40 is removed in the MRAM area 12 such that fangs 64 are formed.

In the present invention, the process and structure includes providing pre-patterned etch stops in the interlayer dielectric where the lines will be (i.e., where the trenches will be formed) and at a depth such that the fractional thickness below the trench remains. In this manner, during via cap open, the pre-patterned etch stop prevents the directional etch needed to open the via cap from removing dielectric underlying the trenches in the non-MRAM areas. That is, the non-MRAM area trench depth is controlled in embedded MRAM application by pre-patterning the etch stop layer such that resulting trenches in the non-MRAM are not excessively deep, thereby preventing shorts between metal interconnect levels as was observed in the prior art. As will be described in greater detail below, the etch stop layer can be formed of barrier layer material such as tantalum nitride that can be left in place or removed. Moreover, the etch stop layer can be patterned on top of the MRAM array to improve overlay tolerance for more aggressive pitches as can be desired for advanced design rules. The MRAM pitch is typically more relaxed relative to standard logic devices.

Optionally, the pre-patterned etch stops can also be formed in the MRAM area 12 to prevent formation of fangs.

Detailed embodiments of the integrated circuit including at least one metal interconnect level overlying an embedded MRAM device and methods for fabricating an integrated circuit including at least one metal interconnect level overlying an embedded MRAM device according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value.

Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Figure 7:
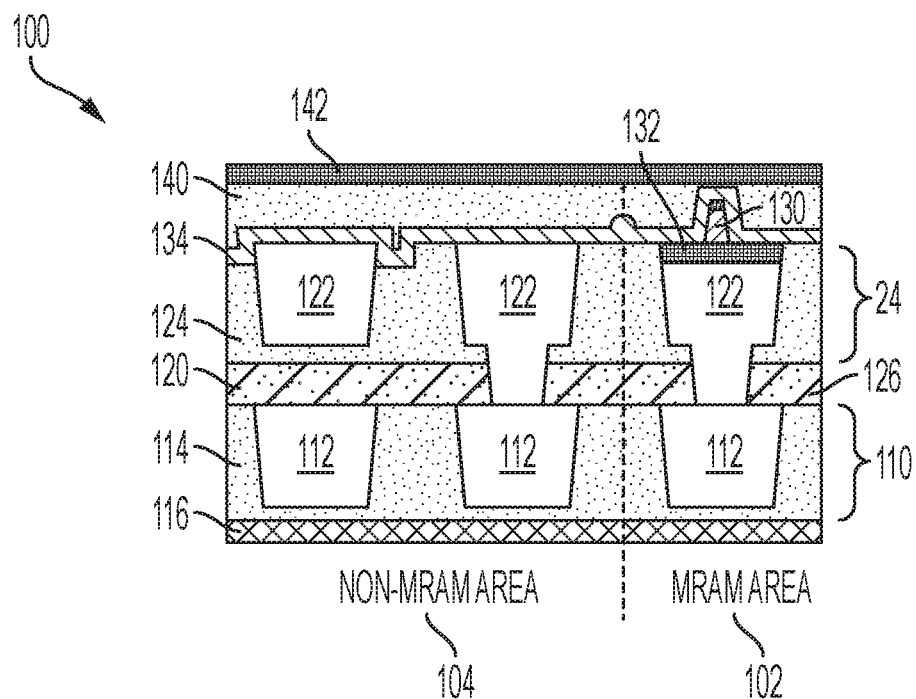
FIG. 7 depicts a cross section of an intermediate structure including a non-magnetoresistive random access memory area (non-MRAM area) including various interconnect levels and a MRAM area including an embedded MRAM device through partial interlayer dielectric fill and deposition of an etch stop layer thereon in accordance with one or more embodiments of the present invention.

Turning now to FIG. 7, there is shown a cross section of an intermediate structure 100 including a MRAM area 102 and a non-MRAM area 104. Common to the MRAM and the non MRAM areas 102, 104 respectively, are a first interconnect level 110 and a second interconnect level 120. The first interconnect level 110 includes a plurality of metal interconnect 112 embedded in an interlayer dielectric 114. The first interconnect level 110 is formed on a dielectric cap layer 116. Similarly, the second interconnect level 120 includes a plurality of metal interconnects 122 embedded in an interlayer dielectric 124. A dielectric cap layer 126 is formed on the second interconnect level 120. The metal interconnects 112, 122 can include liner and/or via features. The dielectric cap layers 116, 126 can be a nitride such as silicon nitride, or a carbon-doped silicon nitride.

Interlayer dielectric layers 114, 124 can be one of a number of different dielectric materials commonly used in integrated circuit fabrication. For example, the dielectric can be silicon dioxide, silicon nitride, or a doped glass layer, such as phosphorus silicate glass, boron silicate glass, and the like. In other embodiments, the dielectric layer can be a low k dielectric layer, wherein low k generally refers to materials having a dielectric constant less than silicon dioxide. Exemplary low k dielectric materials include, without limitation, SiCOH dielectric, SiOCN, SiBCN, or low k spin-on dielectrics. Depending upon the particular dielectric material, dielectric layer 12 can be formed by chemical vapor deposition deposited (CVD), plasma enhanced chemical vapor deposition (PECVD), atmospheric deposition as well as spin on techniques. In one or more embodiments, dielectric layer is a chemical vapor deposited material, such as silicon dioxide or silicon nitride, which has been deposited over a planarized dielectric layer.

The metal lines 112, 122 can include a liner layer, i.e., barrier layer, that is conformally deposited onto a patterned dielectric layer including trench openings for forming lines and/or via openings for forming contacts to an underlying metal interconnect. Exemplary liner materials include tantalum, tantalum nitride, cobalt, ruthenium, titanium nitride, and combinations of more than one material (for example tantalum nitride/tantalum or tantalum nitride/cobalt). The presence of the liner layer such as titanium nitride, for example, insures that a bulk metal such as copper that forms the metal line will not further diffuse into underlying dielectric layers or along sidewall interfaces during subsequent annealing processes.

After the deposition of the liner layer, a conformal seed layer (not shown) is typically deposited. The function of the seed layer is to provide a base upon which a copper conductor can be deposited. The seed layer can be formed by one or more methods known to those skilled in the art. For example, the seed layer can be formed by chemical vapor deposition (CVD), physical vapor deposition (PVD), or some variation of these two deposition processes, and is typically composed of copper or a copper alloy (for example, copper-aluminum, copper-manganese). The seed layer can also be formed electrochemically or by an electroless process. In the case of PVD, the seed layer can be deposited by reactive or non-reactive sputtering from a single alloy target, or from multiple targets, by ionized sputtering. In the case of a dual damascene process, the seed layer can be deposited on an underlayer disposed in a via within a dielectric material.

The composition of one of the metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of the bulk metal such as copper is then deposited. In some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %. The bulk metal such as copper can be formed by CVD, sputtering, electrochemical deposition or like processes. For example, the deposition of copper can proceed by electrochemical deposition such as electroplating or electroless plating.

Following deposition of the bulk metal, the substrate 100 is typically subjected to a planarization process to remove the metal overburden such that a top surface of the metal is substantially coplanar to the interlayer dielectric. For example, the surface can be planarized using an electropolishing process. In an electropolishing process small amounts of copper are etched from the copper by electroetch or electrochemical etching to provide a copper interconnect having a top metal surface generally coplanar to the top surface of the interlayer dielectric. In another embodiment, the planar surface is formed by chemical-mechanical-polishing (CMP), using a non-selective slurry composition. The slurry composition contains a silica abrasive material, which removes the different metal layers at substantially the same rate.

As shown, the structure 100 further includes a MRAM device 130 such as a MTJ device. The MTJ 130 is formed on a metal interconnect 122 in the MRAM area 102, which functions as a bottom electrode and can include a conductive metal cap 132 such as tantalum to provide a planar surface for forming MTJ device. Multiple layers define the MTJ, which are not intended to be limited and generally includes two magnetic layers such as $Co_xFe_yB_z$ separated by a thin dielectric barrier such as magnesium oxide or aluminum oxide and a mechanism to pin the polarization of one of the magnetic layers in a fixed direction. The MTJ is raised relative to the top surfaces of the metal interconnects 122 of the second interconnect level 120 in the non-MRAM area 104.

An insulation layer 134 is provided on the second interconnect level 120. The insulating layer 134 can include any dielectric material or materials that would serve as an electrically insulating layer. In one or more embodiments, the insulation layer 134 includes a nitrogen-doped silicon carbide, or silicon nitride.

An interlayer dielectric 140 is deposited onto the insulation layer 134. The thickness of the interlayer dielectric 134 represents a partial thickness of the interlayer dielectric. In one or more embodiments, the thickness of the interlayer dielectric is at a height about equal to the top of the insulation layer 134 overlying the MRAM device 134.

An etch stop layer 142 is deposited onto the interlayer dielectric 140. The etch stop layer is not intended to be limited and can be an etch resistant material. By way of example, the etch resistant material can be tantalum nitride or a dielectric. The partial interlayer dielectric can be subjected to a planarization process prior to deposition of the etch resistant layer 142.

Figure 8:
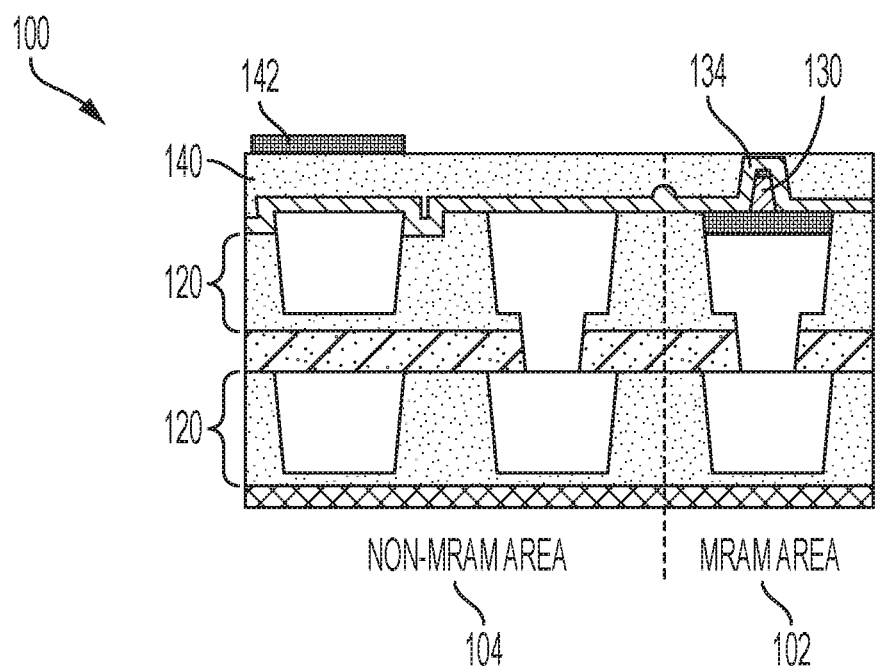
FIG. 8 depicts a cross section of the structure of FIG. 7 subsequent to patterning the etch stop layer in accordance with one or more embodiments of the present invention.

FIG. 8 depicts a cross section of the structure of FIG. 7 subsequent to patterning the etch stop layer 142. The patterned etch stop layer 142 is provided where lines 122 in non-MRAM areas 104 will land and in one or more embodiments, can also include where lines (not shown) in MRAM areas 102 will land so as to prevent fang formation as shown in PRIOR ART FIG. 6 above.

Figure 9:
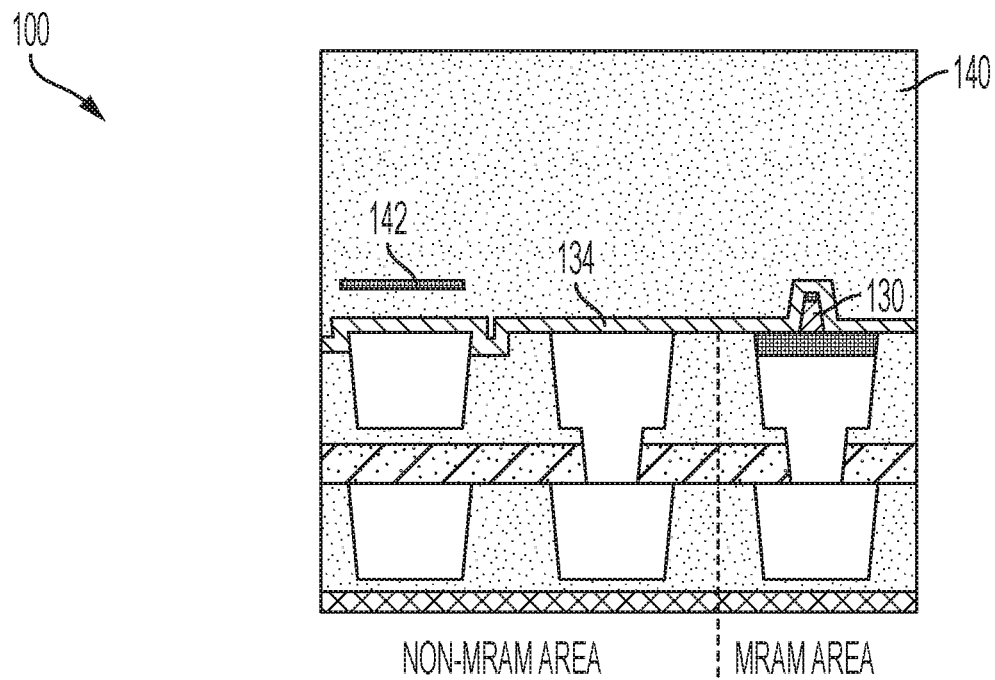
FIG. 9 depicts a cross section of the structure of FIG. 8 subsequent to deposition of the remaining interlayer dielectric in accordance with one or more embodiments of the present invention.

FIG. 9 depicts a cross section of the structure of FIG. 8 subsequent to deposition of the remaining thickness intended for the interlayer dielectric 140, which serves to embed the patterned etch stop layer as shown.

Figure 10:
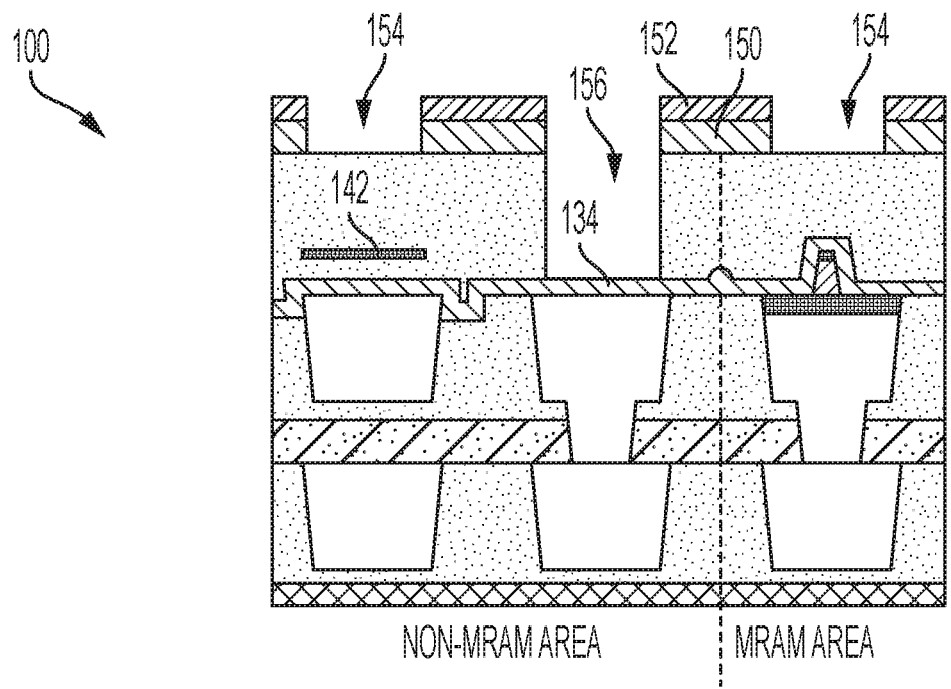
FIG. 10 depicts a cross section of the structure of FIG. 9 subsequent to via open to the cap layer in accordance with one or more embodiments of the present invention.

FIG. 10 depicts a cross section of the structure of FIG. 9 subsequent to via open to the cap layer. The via open can be a directional etch such as reactive ion etch. A multilayer lithographic structure is deposited in a manner similar to that discussed above with respect to prior art FIG. 1 and etched to form the trench openings 154 and via openings 156 in a hardmask layer 152 and a sacrificial nitride layer 154. The via open 156 is further etched into the dielectric 140 to the cap layer. The via open etch process does not contact the etch stop layer.

Figure 11:
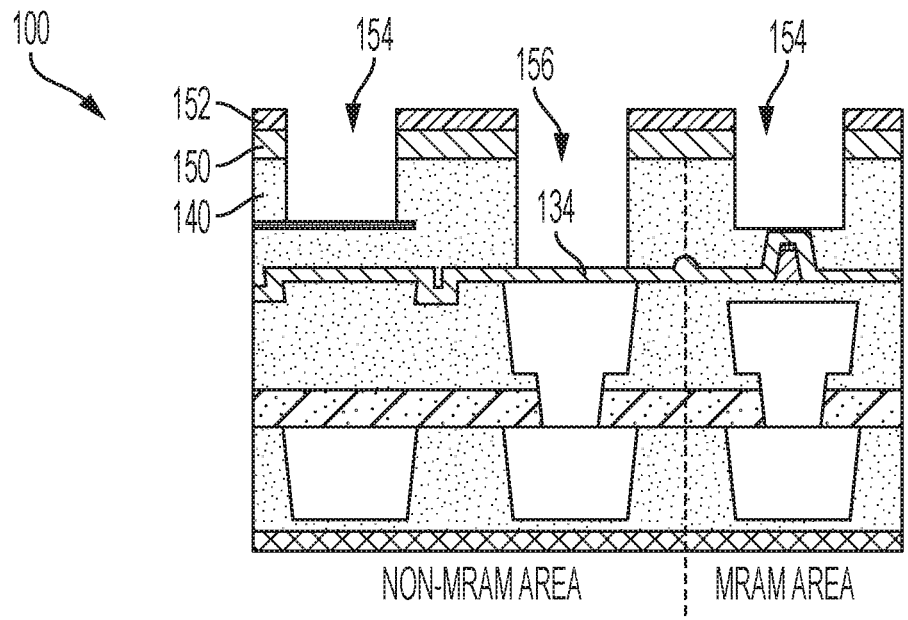
FIG. 11 depicts a cross section of the structure of FIG. 10 subsequent to trench open stopping on the etch stop layer and exposing the cap layer in the MRAM area in accordance with one or more embodiments of the present invention.

FIG. 11 depicts a cross section of the structure of FIG. 10 subsequent to trench open stopping on the etch stop layer and exposing the cap layer in the MRAM area. The trench openings 154 are etched into the dielectric layer 140 using a directional etch such as a reactive ion etch. The directional etch stops at the etch stop layer 142 and the cap layer 134 on the MTJ device, which is at the same height as the etch stop layer.

Figure 12:
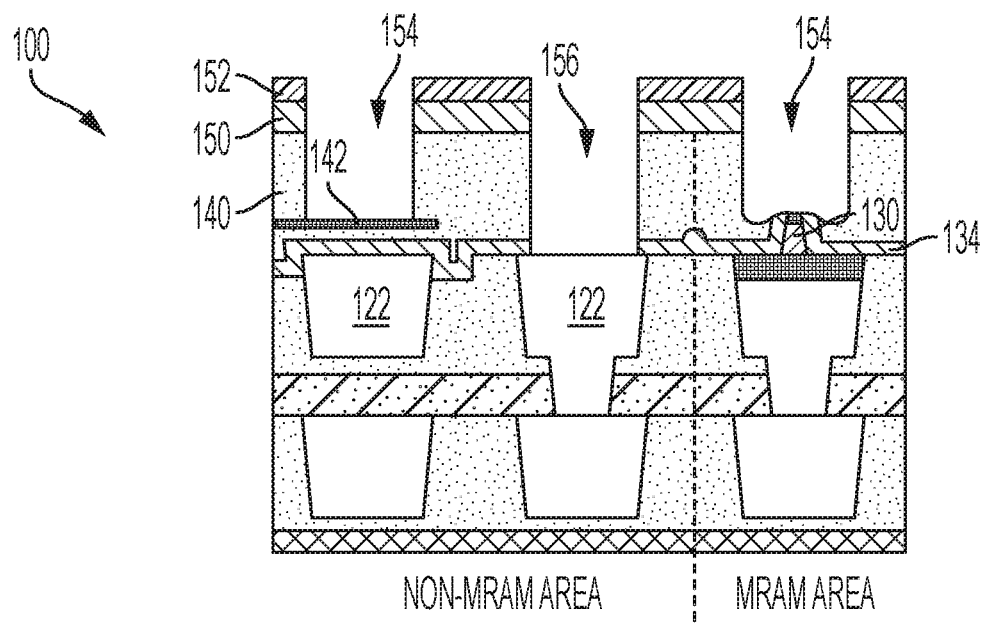
FIG. 12 depicts a cross section of the structure of FIG. 11 subsequent to selective removal of the cap layer to expose an underlying interconnect and a top electrode of the MRAM device in accordance with one or more embodiments of the present invention.

FIG. 12 depicts a cross section of the structure of FIG. 11 subsequent to selective removal of the via cap layer 134 to expose the underlying interconnect 122 and a top electrode of the MRAM device 130. The cap open etch process does not significantly deepen the trenches in the non-MRAM area 104 because of the presence of the etch stop layer 134. Optionally, fang formation can be prevented should the etch stop layer 134 be provided in the MRAM area 102.

Advantageously, non-MRAM trench depth control in embedded MRAM applications can be achieved by pre-patterning an etch stop layer. Also, it should be apparent that pre-patterned etch stop layer can be removed or kept in place. Moreover, as noted above, the etch stop layer can also be patterned on top of the MRAM array to improve overlay tolerance for more aggressive pitches.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method for integrating an embedded memory device, the method comprising:
    providing a wafer having an embedded magnetoresistive random access memory (MRAM) interconnect level comprising metal interconnects formed within a first interlayer dielectric, wherein at least one of the metal interconnects functions as a bottom electrode for the embedded MRAM device formed thereon to define a MRAM area, wherein the MRAM device structurally forms a pillar having a height greater than a height of the metal interconnects provided in a non-MRAM area;
    depositing an insulating layer onto the wafer;
    depositing a portion of a second interlayer dielectric onto the insulating layer to a thickness equal to a combined height provided by the insulating layer and the MRAM device;
    depositing an etch stop layer onto the portion of the second interlayer dielectric at the combined height;
    patterning the etch stop layer to form a patterned etch stop overlying lines in the non-MRAM area;
    depositing a remaining portion of the second interlayer dielectric;
    depositing a multilayer lithographic structure onto the second interlayer dielectric, the multilayer lithographic structure comprising a sacrificial nitride layer and a hardmask layer thereon;
    patterning the sacrificial nitride layer and the hardmask layer to provide trench and via openings;
    etching the via opening to the insulating layer, wherein the via opening is self-aligned to an one of the metal interconnects in the non-MRAM area;
    etching the trench opening in the non-MRAM area to the etch stop layer and to the insulating layer overlying the MRAM device in the MRAM area; and
    removing the insulating layer at the bottom of the via opening and on the MRAM device to expose the underlying metal interconnect in the non-MRAM area and a top electrode of the MRAM device.

2. The method of claim 1, wherein the insulating layer comprises a carbon-doped silicon nitride.

3. The method of claim 1, wherein the MRAM device comprises a magnetic tunneling junction device.

4. The method of claim 1, wherein etching the via opening and the trench opening comprises a reactive ion etching process.

5. The method of claim 1, wherein bottom electrode comprises a conductive cap layer.

6. The method of claim 1, wherein patterning the etch stop layer to form the patterned etch stop further comprises providing the patterned etch stop layer overlying lines in the MRAM area.

7. The method of claim 1, wherein the trench opening in the non-MRAM area remains at a constant depth prior to and subsequent to removing the insulating layer at the bottom of the via opening and on the MRAM device.

* * * * *